US006436848B1

(12) United States Patent
Ramkumar

(10) Patent No.: US 6,436,848 B1
(45) Date of Patent: Aug. 20, 2002

(54) METHOD FOR FORMING NITROGEN-RICH SILICON OXIDE-BASED DIELECTRIC MATERIALS

(75) Inventor: Krishnaswamy Ramkumar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/281,672

(22) Filed: Mar. 30, 1999

(51) Int. Cl.$^7$ .................. H01L 21/31; H01L 21/469

(52) U.S. Cl. .............. 438/777; 438/770; 438/773; 438/775

(58) Field of Search ................. 438/777, 763, 438/770, 773, 775

(56) References Cited

U.S. PATENT DOCUMENTS

| | | | |
|---|---|---|---|
| 5,744,371 A | 4/1998 | Kadosh et al. ............... | 437/24 |
| 5,783,458 A | 7/1998 | Kadosh et al. ............... | 437/44 |
| 5,808,348 A | 9/1998 | Ito et al. ..................... | 257/410 |
| 5,827,769 A | * 10/1998 | Aminzadeh et al. ......... | 438/305 |
| 6,291,868 B1 | * 9/2001 | Weimer et al. ............... | 257/413 |

OTHER PUBLICATIONS

Toshimasa Matsuoka et al., "Thickness Dependence of Furnace N2O–Oxynitridation Effects on Breakdown of Thermal Oxides," IEICE Trans. Electron., vol. E78–C, No. 3 (Mar. 1995) p. 248–254.

Xu Zeng et al., "AC Hot–Carrier–Induced Degradation in NMOSFET's with N2O–Based Gate Dielectrics," IEEE Elec. Dev. Lett., vol. 18, No. 2, (Feb. 1997) p. 39–41.

I. J. R. Baumvoi et al., "Incorporation of oxygen and nitrogen in ultrathin films of SiO2 annealed in NO," Appl. Phys. Lett., vol. 72, No. 23, (Jun. 1998) p. 2999–3001.

Z. Q. Yao et al., "High quality ultrathin dielectric films grown on silicon in a nitric oxide ambient," App. Phys. Lett., vol. 64, No. 26, (Jun. 1994) p. 3584–3586.

G. Weidner et al., "Nitrogen incorporation during N2O– and NO–oxidation of silicon at temperatures down to 600 C.," Microelectronics Journal, Vol. 27 (1996) p. 647–656 No month.

Takayuki Aoyama et al., "Boron Diffusion in Nitrided–Oxide Gate Dielectrics Leading to High Suppression of Boron Penetration in P–MOSFETs," Jpn. J. Appl. Phys., vol. 37 (1998), p. 1244–1250, No month.

Kuei–Shu Chang–Liao et al., "Boron Penetration Reduction and FN Stress Hardness Improvement in MOS Capacitors By Gate Oxides Rapid–Thermal–Annealed in N2O," Solid–State Electronics, vol. 42, No. 3, p. 425–427 (1998).

Mitra Navi et al., "Investigation of Boron Penetration Through Thiun Gate Dielectrics Including Role of Nitrogen and Fluorine," J. Electrochem. Soc., vol. 145, No. 7, (Jul. 1997) p. 2545–2548.

(List continued on next page.)

*Primary Examiner*—Alexander G. Ghyka

(57) ABSTRACT

A nitrogen-rich silicon oxide layer is formed using an apparatus for oxidizing semiconductor substrates having a process zone or chamber fluidically coupled to a torch zone or chamber. Generally, a thin initial silicon oxide layer is formed on the substrate using common wet or dry oxidizing processing conditions. Subsequently, a nitridizing atmosphere is introduced to the semiconductor substrates causing a nitrogen-rich silicon oxide layer to be formed thereon. The nitridizing atmosphere is advantageously generated by an exothermic reaction within the torch zone. Once formed, the nitridizing atmosphere is directed to the process zone through the fluidic coupling. The advantageous exothermic reaction resulting from the introduction of nitrous oxide ($N_2O$) to the torch zone at a temperature sufficiently high to induce such an exothermic reaction, generally between approximately 850 to 950 degrees Celsius. Semiconductor integrated circuits are formed using nitrogen-rich silicon oxide films of the current method.

18 Claims, 4 Drawing Sheets

OTHER PUBLICATIONS

K.A. Ellis et al., "Boron Diffusion in Silicon Oxides and Oxynitrides," J. Electrochem. Soc., vol. 145, No. 6 (Jun. 1998), 2068–2074.

Michael Rohrig et al., "The Pressure Dependence of the Thermal Decomposition of N2O," Intl. J. of Chem. Kinetics, vol. 28, (1996) p. 599–608.

H. G. Pomp et al., "Lightly N2O nitrided dielectrics grown in a conventional furnace for E2PROM and 0.25um CMOS," IEDM Trans. (1993) p. 463–466.

K.A. Ellis et al., "Furnace gas–phase chemistry of silicon oxynitridation in N2O," Appl. Phys. Lett. vol. 68(12), Mar. 18, 1996, p. 1696–1698.

Michael J. Hartig et al. "A Model for the Gas–Phase Chemistry Occurring in a Furnace N2O Oxynitride Process," J. Electrochem. Soc. vol. 143, No. 6, (May 1996) p. 1753–1762.

M. Bhat et al., "Growth kinetics of oxides during furnace oxidation of Si in N2O ambient," J. Appl. Phys. vol 78 (4), Aug. 15, 1995, p. 2767–2774.

Yoshio Okada et al., "Uniformity of the N2O Furnace Oxynitride Process for the Formation of Thin Tunnel Dielectrics," J. Electrochem. Soc., vol. 141, No. 12, (Dec. 1994), p. 3500–3504.

Horiba Bulletin HRA–1883 A re: SC–1 Monitor, CS–200 Series.

Horiba Bulletin HRE–0007J entitled "Products for Semiconductor Industry.".

Z–World Products and Services re: OP7100, 3 pp., printed May 24, 1999.

Z–World Products and Services re: PK2200, 3 pp., printed May 24, 1999.

Z–World Products and Services re: XP8100, 2 pp., printed May 24, 1999.

Z–World Products and Services re: XP8500, 1 p., printed Jun. 3, 1999.

Z–World Products and Services re: XP8700, 1 p., printed May 24, 1999.

* cited by examiner

METHOD FOR FORMING NITROGEN-RICH SILICON OXIDE-BASED DIELECTRIC MATERIALS

BACKGROUND

1. Field of the invention

The present invention relates to methods of forming dielectric materials and, more particularly to methods of forming nitrogen-rich silicon oxide-based dielectric materials for use in semiconductor integrated circuit devices.

2. Description of Related Art

As integrated circuit (IC) devices become more advanced to provide enhanced functionality, higher speeds and lower voltage operation, the number of circuit elements per IC generally increases while the allowable area of each of those elements is reduced. While this downward scaling process most obviously involves reducing lateral dimensions, the vertical dimensions of some circuit elements, e.g. gate dielectric film thicknesses, must also be reduced. Thus for a typical high performance transistor with a gate length less than 0.25 micron ($\mu$m), gate dielectric layer thickness will typically be less than 5 nanometers (nm).

Unfortunately, where these thin gate dielectric layers are silicon oxide, some commonly employed dopants can readily diffuse through the layer and impact device performance. For example, in dual poly CMOS technology, boron from a boron doped P-type polysilicon gate electrode can readily diffuse through a conventional silicon oxide gate dielectric and into the underlying N-type channel region. Thus the surface carrier concentration of the underlying region is changed and the threshold voltage ($V_{th}$) degraded. In addition to $V_{th}$ degradation, the susceptibility of thin silicon oxide dielectrics to diffusion of dopants can also lead to other device performance problems. For example, degradation of dielectric integrity and hot carrier resistance.

Nitrogen-rich or nitrided silicon oxide films can provide a barrier to diffusion of dopants such as boron. Hence $V_{th}$ degradation of transistors formed using nitrogen-rich silicon oxide gate dielectrics is reduced. Additionally, such nitrided silicon oxide films have improved hot carrier resistance and dielectric integrity. However, the formation of such films with sufficient peak nitrogen concentration has been problematic.

One previously known method for forming nitrogen-rich silicon oxide films with sufficient peak nitrogen concentration employs ammonia ($NH_3$) nitridization of silicon oxide films at temperatures between 900 and 1200 degrees Celsius (° C.). However, such films are also hydrogen rich making the films unsuitable for use as gate dielectrics in MOSFETs without additional processing to reduce hydrogen content. Another solution to the hydrogen problem is to avoid its inclusion during film formation. To this effect, the use of nitrous oxide ($N_2O$) for direct oxynitridization or nitridization of silicon oxide films has been reported. However, the reported methods seem to require temperatures approaching 1000° C. or a film thickness in excess of 5 nm to provide sufficient peak nitrogen concentration for the film act as a diffusion barrier. Unfortunately, the high temperature processing required to form thin films can result in dopant redistribution and shifts in $V_{th}$. Where Rapid Thermal Processing (RTP) systems are used to limit time at temperature and thus reduce dopant redistribution, film uniformity has been reported to be problematic.

Also known to avoid the inclusion of hydrogen is the use of nitric oxide (NO) for direct oxynitridization or nitridization of silicon oxide films. Advantageously, some reports indicate that films formed using NO have higher peak nitrogen concentration than $N_2O$ formed films for any given process temperature. For example, Z. Q. Yao, et al. ("*High quality ultathin dielectric films grown on silicon in a nitric oxide ambient*", Appl. Phys. Lett., vol. 64 (26), June, 1994, pp. 3584–3586), report that for films formed using RTP systems at 1150° C., the film formed using NO had a peak nitrogen concentration approximately three times greater than the film formed using $N_2O$ (4.4% versus 1.4%). However, while peak nitrogen concentration is high, the growth rate of the films formed using NO is slow and self-limiting making its use problematic.

Thus it would be advantageous to have methods for forming nitrogen-rich silicon oxide films at acceptable growth rates and with acceptable uniformity for use in high performance IC devices without resorting to high temperature processing. It would also be advantageous for such methods to provide thin nitrogen-rich silicon oxide films having a sufficiently high nitrogen concentration to provide enhanced resistance to dopant that avoid the problems of previously known methods. Furthermore, it would be advantageous for such methods to employ well known reagents and equipment thus providing safe, cost-effective wafer processing. Finally, it would also be advantageous to have IC structures and devices that realize the full benefit of both lateral and vertical scaling while having enhanced resistance to $V_{th}$ degradation due to dopant diffusion through gate dielectric layers.

SUMMARY

In accordance with the present invention, methods for forming nitrogen-rich silicon oxide films and the structures and IC's formed thereby, are provided. In some embodiments of the present invention an apparatus for forming a nitrogen-rich silicon oxide film is provided, the apparatus having at least two fluidically coupled zones or chambers. In some embodiments, a first chamber or zone is commonly referred to as a torch zone or torch chamber and a second chamber is commonly referred to as a process zone or process chamber.

Some methods in accordance with embodiments of the present invention provide for the formation of a first silicon oxide film by positioning silicon wafers or other suitable semiconductor substrates in the process chamber of the apparatus and providing an oxidizing atmosphere to that chamber. In some embodiments the atmosphere provided is a dry oxidizing atmosphere while in other embodiments the atmosphere provided is a wet oxidizing atmosphere.

Methods in accordance with embodiments of the present invention also encompass the formation of a nitrogen-rich silicon oxide film by providing a nitridizing atmosphere to the silicon wafers. The term "nitrogen-rich" is understood to mean a peak nitrogen concentration of between approximately 0.5 to 3.5 atomic percent (at %) or higher. In addition, the term "nitridizing atmosphere" is understood to mean an atmosphere that provides for the formation of nitrogen-rich silicon oxide films. In some embodiments providing the nitridizing atmosphere to the silicon wafers encompasses introducing nitrous oxide ($N_2O$) into the torch region at a first temperature. Advantageously, this first temperature is selected to be sufficiently high to promote an exothermic reaction which forms the nitridizing atmosphere. Subsequently the atmosphere formed is directed to the silicon wafers in the process chamber through the fluidic coupling between the chambers.

Embodiments of the present invention also include semiconductor devices and integrated circuits that incorporate nitrogen-rich silicon oxide films formed by methods in accordance with the present invention. For example, such semiconductor devices embodiments encompass devices that employ nitrogen-rich gate dielectric films, tunnel dielectrics or gate sidewall dielectrics formed using the methods of the present invention.

BRIEF DESCRIPTION OF THE DRAWINGS

The present invention may be better understood, and its numerous objects, features, and advantages made apparent to those skilled in the art by referencing the accompanying drawings. For simplicity and ease of understanding, common numbering of elements within the illustrations is employed where an element is the same in different drawings.

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense as it is understood that the present invention is in no way limited to only the embodiments illustrated. For example, in some embodiments of the present invention, isolation regions are formed prior to doping well regions (depicted in FIG. 1A), while in other embodiments, doping of well regions is performed prior to forming isolation regions (not shown).

Figure 1A:
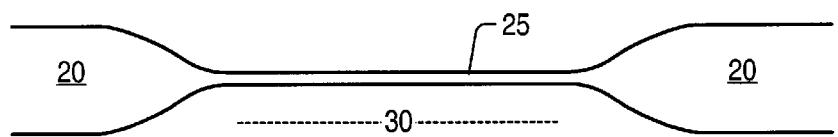
FIGS. 1A–1G are simplified cross-sectional views of a portion of an integrated circuit illustrating various stages in the fabrication of an embodiment of the present invention.

Referring now to FIG. 1A, a semiconductor substrate 10 at an early stage in the fabrication of a semiconductor device, e.g. a transistor, in accordance with an embodiment of the present invention is depicted. Semiconductor substrate or wafer 10 is shown to include an active area 30, isolation regions 20 and a sacrificial layer 25 overlying active area 30. For ease of explanation and understanding, wafer 10 is depicted as having a minimum of complexity. Thus it will be understood that other types of semiconductor substrates or wafers 10 can be advantageously employed for embodiments of the present invention. For example, in some embodiments substrate 10 is an N-type substrate, while in other embodiments substrate 10 is a P-type substrate. Alternatively, substrate 10 can be an N-type or P-type substrate encompassing an epitaxial layer (not shown), a silicon on insulator (SOI) structure (not shown) or any other appropriate semiconductor substrate material or structure.

Isolation regions 20 are depicted in FIG. 1A as having a form readily recognized as resulting from a Localized Oxidation of Silicon (LOCOS) process. However, any other appropriate isolation process, e.g. Shallow Trench Isolation (STI) can also be employed for embodiments of the present invention. Active area 30 is defined laterally by isolation regions 20 and is overlaid by sacrificial layer 25, as depicted. Layer 25 serves as an implant capping layer employed to prevent contamination and/or to reduce the amount of both axial and planar channeling that can occur during ion implantation processing. Sacrificial layer 25 is generally a thermally grown silicon oxide layer formed having an appropriate thickness, however other materials formed using other methods are also know. For example, silicon nitride or any of the various silicon oxynitrides can be formed using a Chemical Vapor Deposition (CVD) method and used for layer 25 in place of the aforementioned thermally grown silicon oxide. In addition, combinations of thermally grown silicon oxide and deposited insulators can also be employed for sacrificial layer 25. While the thickness of sacrificial layer 25 is generally between 15 to 50 nanometers (nm) with 40 nm being a typical thickness, the actual thickness of layer 25 form will depend on the nature of the subsequent implant processing.

Figure 1B:
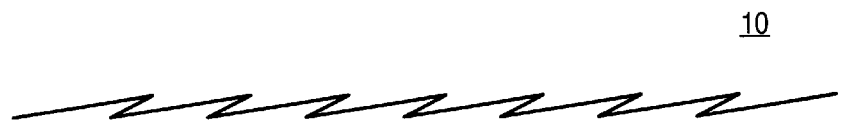

Turning now to FIG. 1B, well ion implant 40 is shown being employed to form a well region 45 in active area 30. The specific dopant type, energy and dose of well implant 40 will depend from the specific type of semiconductor device to be fabricated within active area 30 and the thickness of sacrificial layer 25. Thus where, for example, a 3.0 volt PMOS field effect transistor (FET) is being formed within active area 30, layer 25 is 40 nm thick and ion implant 40 is an N-type dopant, e.g. Phosphorus (P), the dose and energy employed for implant 40 are generally between approximately 2E13 to 3E13 ions/$cm^2$ and 380 to 420 KeV (thousand electron volts), respectively, with 2.5E13 ions/$cm^2$ and 400 KeV being typical. However, it is understood, that well implant 40 can include any of the other appropriate dopant types, energies and doses as are required to fabricate other appropriate semiconductor devices and that these other specific embodiments are within the scope and spirit of the present invention.

Figure 1C:
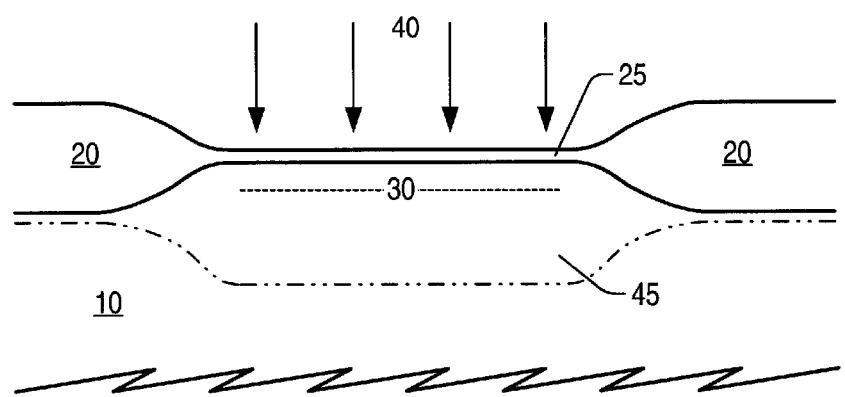

FIG. 1C depicts channel ion implant 50 forming a channel implant region 55 in the structure of FIG. 1B. As discussed with respect to well ion implant 40 (FIG. 1B), the specific dopant type, energy and dose of channel implant 50 will also depend from the specific type of semiconductor device to be fabricated within active area 30. Generally, the dose and energy employed for implant 50 are between approximately 8E12 to 2E13 ions/$cm^2$ and 150 to 200 KeV, respectively, with 1E13 ions/$cm^2$ and 170 KeV being typical. As for implant 40 (FIG. 1B), other appropriate dopant types, energies and doses as are required to fabricate other appropriate semiconductor devices can be used for channel implant 50 and that these specific embodiments are within the scope and spirit of the present invention.

Figure 1D:
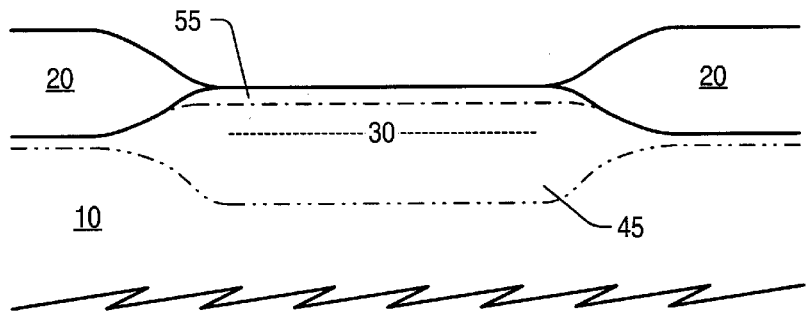

Referring to FIG. 1D, the structure of FIG. 1C is shown where sacrificial layer 25 has been removed. The removal of sacrificial layer 25 is accomplished using any of the commonly employed processes that are tailored to the specific material employed to form layer 25. Thus where layer 25 is a thermally formed silicon oxide material, an etching process employing a buffered aqueous hydrogen fluoride is often employed to remove layer 25, although other appropriate methods can be used.

Figure 1E:
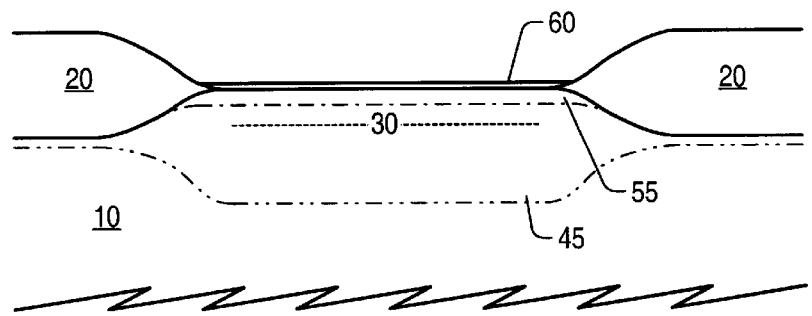
Figure 1F:
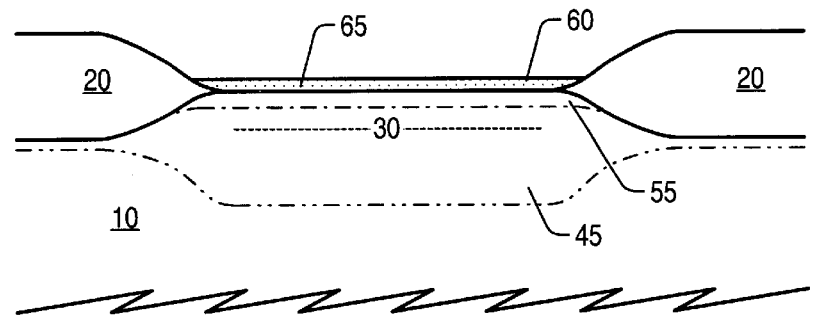

Turning now to FIG. 1E, a first silicon oxide layer 60 is shown overlying active area 30. In FIG. 1F, a second silicon oxide layer 65 is depicted overlying active area 30 and underlying first layer 60 such that a combined dielectric layer 70 (FIG. 1G) is formed. First layer 60 generally has a first thickness between approximately 1–2.5 nm and second layer 65 generally has a second thickness which is also between approximately 1–2.5 nm. Thus combined layer 70 typically has a total thickness of between approximately 2.5–5 nm.

Figure 1G:
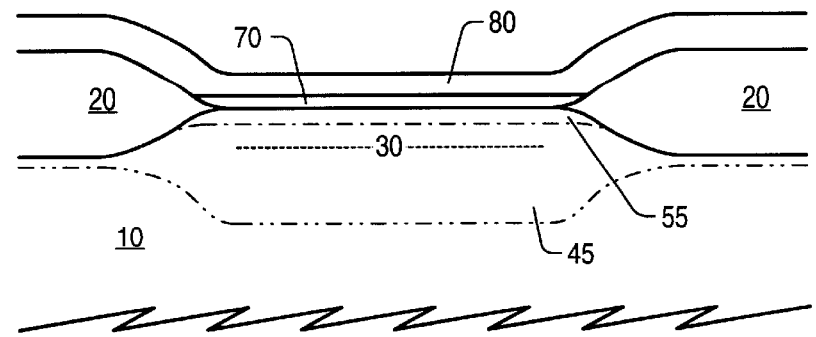
Figure 2:
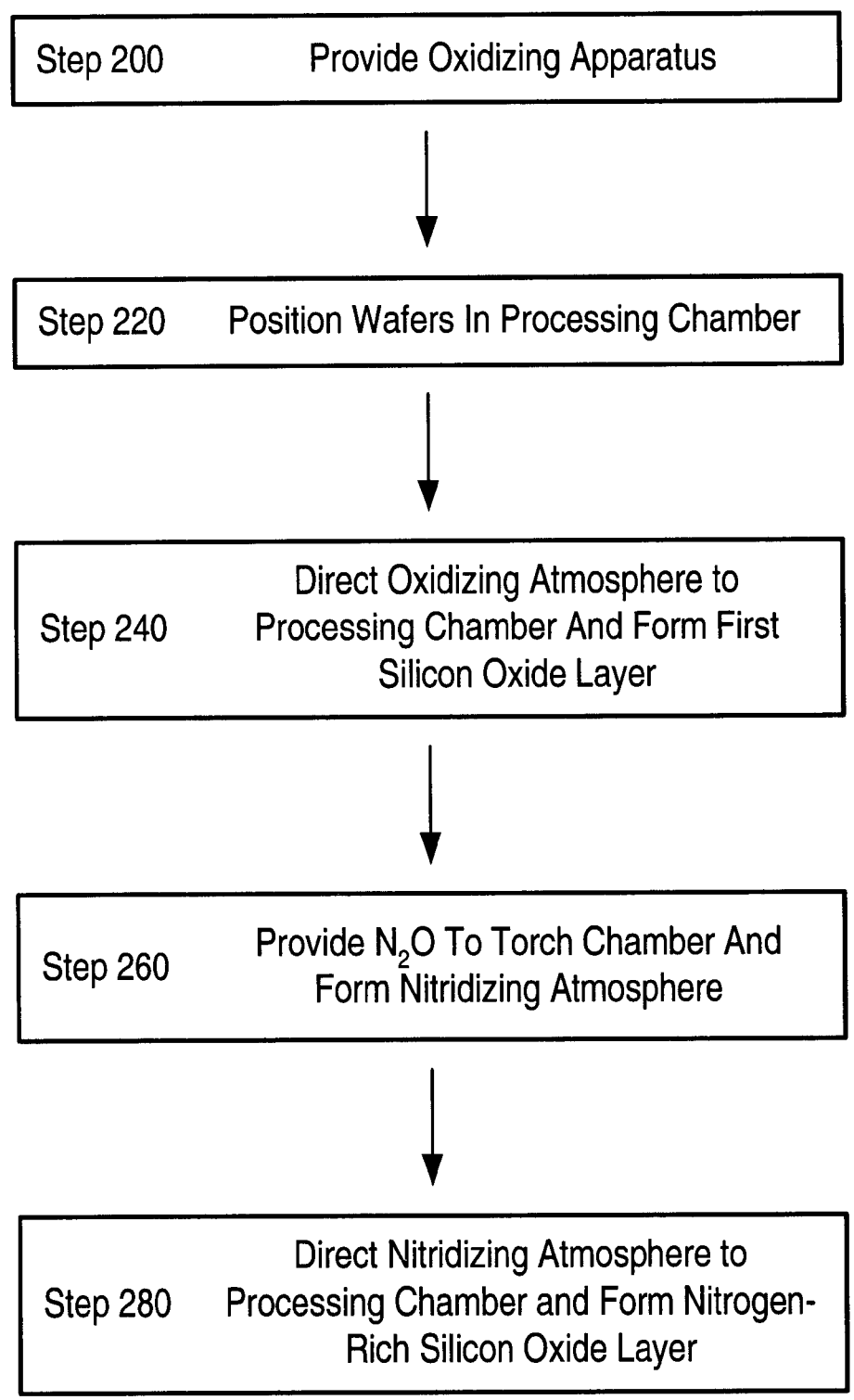
FIG. 2 is a block diagram of process steps used in the fabrication of an integrated circuit in accordance with an embodiment of the present invention.

Turning now to FIG. 2, a block diagram of process steps used in the fabrication of an integrated circuit in accordance with an embodiment of the present invention is shown. Specifically, FIG. 2 depicts processing steps for forming combined layer 70 as depicted in FIG. 1G. In some embodiments of the present invention, the oxidizing apparatus of Step 200 encompasses providing a Silicon Valley Group (SVG) Advanced Vertical Processor Model 9000. In other embodiments, other horizontal or vertical furnaces or rapid thermal processing (RTP) systems having at least two fluidically coupled zones are employed. The oxidizing apparatus provided has at least one zone or processing chamber configured to hold one or more semiconductor substrates and to provide heat to the substrates such that a first temperature can be maintained. It will be understood that any of the commonly employed heating and heat controlling mechanisms can be employed for the purpose of the instant invention. It will also be understood that by "zone" or "processing chamber", the inventors are merely defining a region of the oxidizing apparatus within which the environment is controlled for the purpose of forming essentially uniform films, as commonly understood. Thus the process chamber or zone of the aforementioned oxidizing apparatus can equally be a region within a horizontal or vertical furnace or an RTP tool.

Still referring to FIG. 2, in Step 220, semiconductor substrates or wafers are first positioned within the process chamber and allowed to reach thermal equilibrium at a first process temperature. In some embodiments of the present invention, the first process temperature is as low as 750 degrees Celsius (° C.) while in other embodiments the first temperature is higher. Generally, the first process temperature is between approximately 750 to 900° C. with approximately 800° C. being typical, although other appropriate process temperatures can be employed.

In Step 240, after the substrates reach thermal equilibrium, an oxidizing atmosphere is directed to the wafers. In some embodiments in accordance with the present invention a dilute wet oxidizing atmosphere is employed and for other embodiments a dry oxidizing atmosphere employed. Where a dilute wet oxidizing atmosphere is directed to the wafers, it has been found advantageous to provide hydrogen ($H_2$) and oxygen ($O_2$) in separate gas streams to a torch zone or torch chamber of the oxidizing apparatus, Generally the torch zone is maintained at a torch temperature between approximately 750 to 900° C. with approximately 850° C. being typical. This $H_2$ and $O_2$ mixture, with any reaction products, is then directed to the process zone through a fluidic or gaseous coupling between the chambers. In this manner, the first process temperature of the processing chamber remains essentially unchanged. Advantageously, it has been found that H2 flow rates between approximately 2 to 8 standard liters per minute (SLM) and $O_2$ flow rates between approximately 1 to 6 SLM are appropriate, with 5 SLM and 4 SLM, respectively, being typical flow rates. For embodiments in accordance with the present invention that employ a dry oxidizing atmosphere, it has been found advantageous to employ the torch chamber as just described, but without $H_2$ flow. Thus for such dry oxidizing atmosphere embodiments only $O_2$ is introduced into the torch chamber and then directed into the process chamber. Generally, an $O_2$ flow rate of between 8 to 12 SLM is used with a flow rate of 10 SLM being typical. In some embodiments of the present invention that employ a dry oxidizing atmosphere, small amounts of hydrochloric acid (HCl) or organic chlorine precursors such as TCA (trichloroacetate) are employed during the formation of first silicon oxide layer 60 (FIG. 1E) and added to the $O_2$ introduced to the torch chamber.

It will be understood that while ranges for temperatures and gas flow rates have been provided for the oxidizing atmospheres of Step 240, the specific values selected for temperatures and flow rates actually employed, depend in part on the thickness of the layer formed. Thus to form a 1.8 nm thick first silicon oxide layer 60 using a dilute wet oxidation process, as described above, with the typical values for gas flow and temperatures, it has been found appropriate to direct the oxidizing atmosphere to the process chamber, at a process temperature of 800° C., for approximately 2 minutes.

In some embodiments in accordance with the present invention, after formation of first silicon oxide layer 60 (FIG. 1E), the temperature of the process zone is increased and the substrates again allowed to reach thermal equilibrium. Thus, after growing the aforementioned 1.8 nm layer 60 at, for example 800° C., the temperature of the process zone is increased to 900° C. before proceeding with the formation of second layer 65 (FIG. 1F).

Still referring to FIG. 2, Step 260 provides nitrous oxide ($N_2O$) to the torch zone of the oxidizing apparatus to form a nitridizing atmosphere. For some embodiments, the torch zone is typically maintained at a first temperature, or torch introduction temperature, of approximately 900° C. while for other embodiments, higher or lower torch introduction temperatures are used, for example between about 850 to 950° C. The specific torch temperature being selected so that upon introduction of $N_2O$, an exothermic reaction is occurs, this exothermic reaction resulting in an increase of the torch chamber temperature by 50 degrees or more. It is believed that this exothermic reaction results in the decomposition of at least some of the $N_2O$ introduced, to form, among other things, nitric oxide (NO), where this in situ formed NO advantageously provides for forming nitrogen-rich silicon oxide-based films regardless of film thickness. It is also believed that the magnitude of temperature increase due to the exothermic reaction depends, among other things, on (1) the temperature of the torch zone when the $N_2O$ is introduced; (2) the $N_2O$ flow rate; and (3) the time over which $N_2O$ flow is continued. Thus it has been observed that $N_2O$ flow rates between continued for approximately 2 to 5 SLM can result in the temperature of the torch zone increasing from 900° C. to as high as 1050° C.

In Step 280, the nitridizing atmosphere formed in Step 260 is directed from the torch chamber to the process chamber and, as depicted in FIG. 1F, a second silicon oxide layer 65 is formed. As shown, layer 65 is formed overlying active area 30 and underlying first layer 60. Thus, layer 65 is formed at the interface of layer 60 and active area 30 (FIG. 1E) to create combined layer 70 (FIG. 1G). Where it is desired that second layer 65 have a thickness of approximately 1.5 nm it has advantageously been found that an initial torch zone temperature of 900° C., a $N_2O$ flow rate of 3 SLM continued for a 30 minute period is appropriate. As mentioned, it has been previously known to directly introduce $N_2O$ to the semiconductor substrates for oxynitridization in both conventional vertical and horizontal furnaces as well as in Rapid Thermal Processing (RTP) systems.

However, as noted, such direct introduction has resulted in slow growth of films with relatively low peak nitrogen concentration unless processing temperatures approaching 1000° C. are employed or films in excess of 5 nm are formed. Advantageously, embodiments in accordance with the present invention do not directly introduce $N_2O$ to the substrates. Rather a nitridizing atmosphere is formed in a remote location and the gaseous byproducts of the formation reaction directed to a processing chamber to form uniform, nitrogen-rich silicon oxide-based films or layers.

Figure 3:
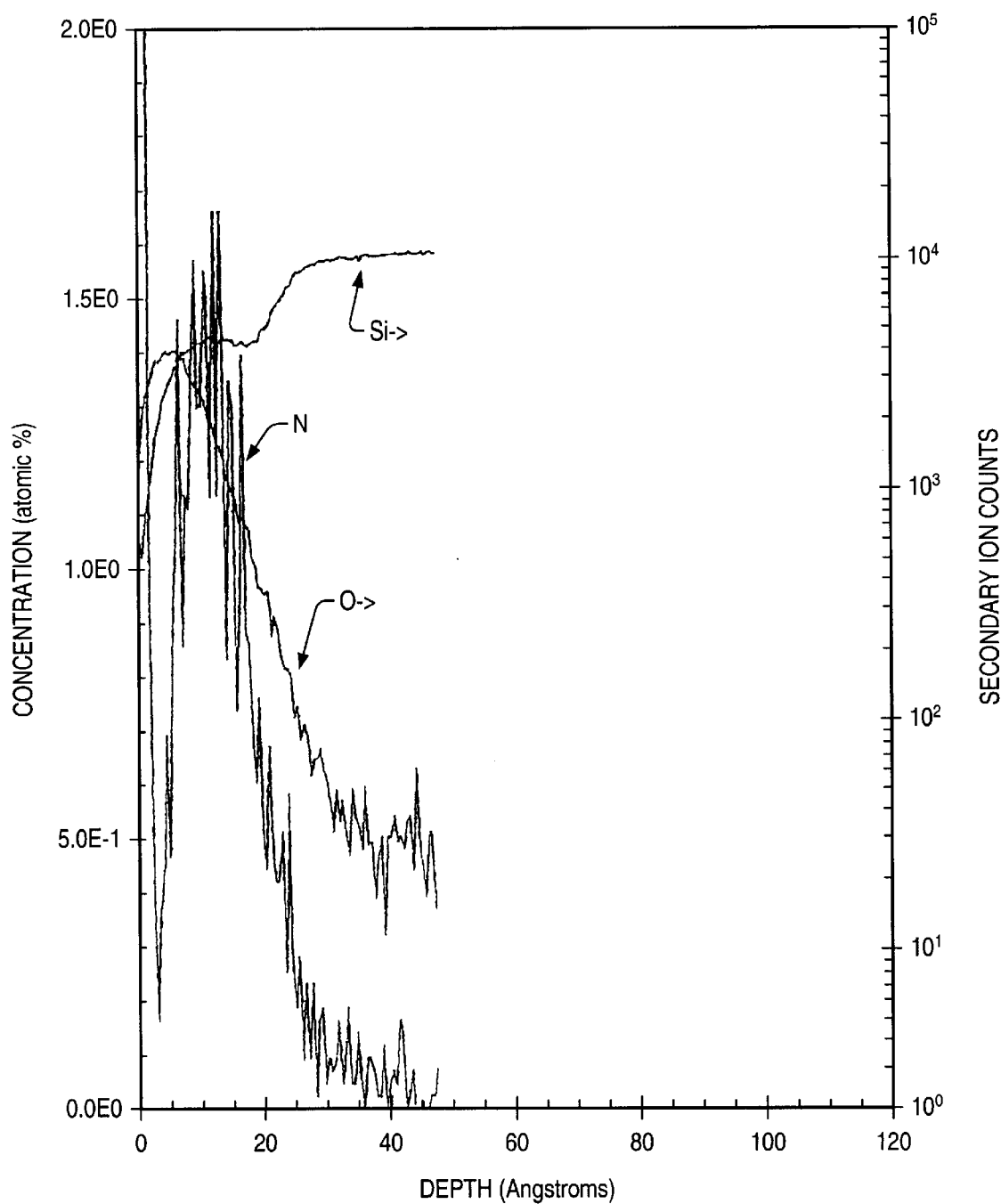
FIG. 3 is a Secondary Ion Mass Spectroscopy (SIMS) profile depicting nitrogen, oxygen and silicon concentrations of a nitrogen-rich silicon oxide-based dielectric film formed in accordance with an embodiment of the present invention.

As previously mentioned, it is believed that the nitridizing atmosphere formed by the exothermic reaction of Step 260 includes NO, as the peak nitrogen concentration of layer 65 (FIG. 1F) exceeds what has been previously observed for processes employing direct introduction of $N_2O$. Turning to FIG. 3, a secondary ion mass spectroscopy (SIMS) profile of combined layer 70 (FIG. 1G) formed in accordance with an embodiment of the present invention is shown. The SIMS profile plots nitrogen concentration (N) as atomic percent (at. %) on the left Y-axis and secondary ion counts for oxygen (O) and silicon (Si) on the right Y-axis versus depth on the X-axis. As seen, peak nitrogen concentration reaches approximately 1.5 at. % at or near the interface with the wafer, which is essentially within layer 65. Thus, embodiments in accordance with the present invention provide for thin, less than 5 nm thick, nitrogen-rich layers, having 1.5 at. % nitrogen or more, as previously defined herein, without the need for processing temperatures in excess of 1000° C.

Turning again to FIG. 1G, the structure of FIG. 1F is shown after deposition of a polysilicon layer 80. Poly layer 80 is generally deposited as an undoped material and then subsequently doped by ion implantation or other commonly employed doping processes. Poly layer 80 is shown overlying combined nitrogen-rich layer 70. As previously discussed, where an underlying dielectric layer is a thin silicon oxide material, the process of doping of poly layer 80 can result in diffusion of some dopant through the thin dielectric layer and into the underlying region. In this manner, resulting in degradation of device performance, for example in a PMOS FET such diffusion would reduce threshold voltage ($V_{th}$). However, where a nitrogen-rich silicon oxide-based material is employed to form a layer, for example as described for combined nitrogen-rich layer 70, little or no such diffusion occurs. Referring now to Table 1, threshold voltages ($V_{th}$) for a number of P Channel

TABLE 1

| Sample No. | Gate Dielectric Process | $BF_2$ Energy (KeV) | $V_{th}$ (Volts) |
|---|---|---|---|
| 1 | Control | 30 | 8.64 |
| 2 | Control | 30 | 8.84 |
| 3 | Control | 10 | 2.88 |
| 4 | Control | 10 | 2.60 |
| 5 | Torch 600° C./Process Chamber 900° C. | 30 | 5.73 |
| 6 | Torch 600° C./Process Chamber 900° C. | 30 | 5.60 |
| 7 | Torch 600° C./Process Chamber 900° C. | 10 | 1.66 |
| 8 | Torch 600° C./Process Chamber 900° C. | 10 | 1.37 |
| 9 | Torch 600° C./Process Chamber 850° C. | 30 | 7.66 |
| 10 | Torch 600° C./Process Chamber 850° C. | 30 | 7.73 |
| 11 | Torch 600° C./Process Chamber 850° C. | 10 | 2.42 |
| 12 | Torch 600° C./Process Chamber 850° C. | 10 | 1.96 |
| 13 | Torch 900° C./Process Chamber 900° C. | 30 | 1.02 |
| 14 | Torch 900° C./Process Chamber 900° C. | 30 | 0.85 |
| 15 | Torch 900° C./Process Chamber 900° C. | 10 | 0.28 |
| 16 | Torch 900° C./Process Chamber 900° C. | 10 | 0.19 |
| 17 | Torch 900° C./Process Chamber 850° C. | 30 | 2.67 |
| 18 | Torch 900° C./Process Chamber 850° C. | 30 | 2.42 |
| 19 | Torch 900° C./Process Chamber 850° C. | 10 | 0.79 |
| 20 | Torch 900° C./Process Chamber 850° C. | 10 | 0.59 | test transistors are shown to compare $V_{th}$ degradation for 10 and 30 KeV $BF_2$ implanted gate electrodes overlying a variety of gate dielectric films. For each sample the gate dielectric layer thickness is nominally 3.5 nm and the layer formed by the process indicated. For samples 1–4 the entire gate dielectric layer was formed using a standard dilute wet oxidation process. For samples 5–20 the gate dielectric layer was formed in a two step process. In the first step a first silicon oxide layer nominally 1.8 nm thick was formed using the standard dilute wet oxidation process. For samples 5–12, the second step encompassed introduction of $N_2O$ to the torch chamber at a temperature of 600° C. The gas flow was then directed to the process chamber which was maintained at 900° C. for samples 5–8 and at 850° C. for samples 9–12. Gas flow was continued for a time sufficient to obtain the nominal gate dielectric layer thickness of 3.5 nm. Samples 13–20 represent gate dielectric layers formed in accordance with embodiments of the present invention. Thus as compared to samples 1–12, the torch chamber temperature was increased to 900° C. For samples 13–16, during introduction of the nitridizing atmosphere, the process chamber temperature was held at 900° C. and for samples 17–20 the process chamber was held at 850° C. Gas flow from the torch chamber was continued as described above, for a time sufficient to obtain the nominal gate dielectric layer thickness of 3.5 run.

Still referring to Table 1, as previously mentioned it is known that boron from a boron doped P-type polysilicon gate electrode can diffuse through a thin silicon oxide gate dielectric and degrade the $V_{th}$ of the transistor. Thus as observed for samples 1–4 it is seen that the thin silicon oxide gate dielectric provides little or no barrier to boron diffusion as $V_{th}$ is increased to almost 9 V for the 30 KeV implanted gate electrodes and to almost 3 V for the 10 KeV implants. As it is necessary for $V_{th}$ to be as close to 0 V as possible for optimal performance, it will be understood that the transistors of samples 1–4 would provide unacceptable performance.

As it has been observed that a torch chamber temperature of 600° C. does not induce an exothermic reaction upon the introduction of $N_2O$, it is believed that samples 5–12 are essentially similar to previously known oxynitridization processes where $N_2O$ is introduced directly to the silicon wafers in the process chamber. As expected, some improvement over samples 1–4 is observed due to the incorporation of some nitrogen. As previously mentioned, however, at a $N_2O$ introduction temperature of 900° C. an exothermic reaction is observed. Thus samples 13–20 represent transistors formed in accordance with embodiments of the present invention. The benefit of the present invention is thus readily seen. For example, where $V_{th}$ for sample 5 is 5.73 V, $V_{th}$ for sample 13 is 1.02 V, a five-fold improvement. Significant improvements are also observed for samples with 10 KeV $BF_2$ implants, and for samples where the process chamber was maintained at 850° C. during nitridization. Thus a six-fold improvement in $V_{th}$ is seen between samples 15 and 16 as compared to samples 7 and 8. And comparing samples 17 and 18 to samples 9 and 10, a three-fold improvement in $V_{th}$ is seen.

It should by now be apparent that methods of forming nitrogen-rich silicon oxide-based dielectric materials have been provided. An that these methods provide for significant improvement in the $V_{th}$ measured for transistors made using these methods. As shown, embodiments in accordance with the present invention do not require the high temperature processing of previously known methods to achieve acceptably high nitrogen concentration, film growth rate and film uniformity. Additionally, embodiments of the present invention achieve high nitrogen concentrations while providing for ultra-thin dielectric layers 5 nm thick or less. In addition, only well known materials and reagents are employed. Thus unlike some previously known methods, nitric oxide (NO), if present, is formed in situ only, thus minimizing handling and other safety concerns that the use of bulk NO might create. Device performance data, specifically uniformly high threshold voltage data ($V_{th}$), has shown that the nitrogen-rich silicon oxide materials used to form the films of the present invention have sufficiently high nitrogen concentrations to provide enhanced resistance to dopant diffusion. Thus it should be evident that it would be advantageous to employ methods in accordance with the present invention to form IC structures and devices having enhanced resistance to $V_{th}$ degradation due to dopant diffusion through gate dielectric layers. For example, IC structures and devices such as those formed to provide the measurements of Table 1 or any other such IC device where nitrogen-rich silicon oxide-based films are advantageously employed. Thus, it will be understood that in addition to the PMOS structures of Table 1, IC devices and structures that employ tunnel dielectric regions and spacer dielectrics, made in accordance with embodiments of the present invention, will also exhibit significant performance improvements and are thus within the scope and spirit of the present invention. In addition, by utilizing methods of the present invention to form these nitrogen-rich silicon oxide-based dielectric materials, the IC structures and devices so formed are thus able to take full advantage of scaling both lateral and vertical dimensions.

We claim:

1. A method for forming nitrogen-rich silicon oxide material comprising:
   introducing nitrous oxide ($N_2O$) to a torch chamber of an oxidizing apparatus, said torch chamber heated to a torch introduction temperature, wherein an exothermic reaction forming a nitridizing atmosphere occurs therein; and
   directing said nitridizing atmosphere from said torch chamber to a process chamber of said oxidizing apparatus wherein a layer of said nitrogen-rich silicon oxide material is formed on a semiconductor substrate.

2. The method of claim 1 comprising forming a layer of silicon oxide on said semiconductor substrate prior to forming said nitridizing atmosphere.

3. The method of claim 2 wherein forming a layer of silicon oxide comprises heating said process chamber to a first temperature between approximately 750 and 850 degrees Celsius (° C.).

4. The method of claim 3 wherein forming a layer of silicon oxide comprises oxidizing said semiconductor substrate within said process chamber with a dry oxidizing atmosphere to form said layer of silicon dioxide having a thickness between approximately 1 to 2.5 nanometers (nm).

5. The method of claim 4 wherein in forming a layer of silicon oxide comprises introducing oxygen to said torch chamber at a flow rate of between approximately 8 to 12 standard liters per minute (SLM).

6. The method of claim 3 wherein forming a layer of silicon oxide comprises oxidizing said semiconductor substrate within said process chamber with a dilute wet oxidizing atmosphere to form said layer of silicon dioxide having a thickness between approximately 1 to 2.5 nanometers (nm).

7. The method of claim 6 wherein in forming a layer of silicon oxide comprises introducing oxygen and hydrogen to said torch chamber at flow rates of between approximately 1 to 6 standard liters per minute (SLM) and 2 to 8 SLM, respectively.

8. The method of claim 1 wherein said torch chamber is heated to a torch introduction temperature between approximately 850 and 950° C.

9. The method of claim 1 wherein said exothermic reaction comprises increasing said torch introduction temperature by at least approximately 50° C.

10. The method of claim 1 wherein introducing nitrous oxide ($N_2O$) to a torch chamber comprises introducing said $N_2O$ at a flow rate between approximately 2 to 5 standard liters per minute (SLM).

11. The method of claim 1 wherein directing said nitridizing atmosphere from said torch chamber to form said nitrogen-rich silicon oxide material, comprises forming a silicon oxide material having a peak nitrogen concentration of between approximately 1 to 3.5 percent (%).

12. The method of claim 11 wherein directing said nitridizing atmosphere to form said layer of nitrogen-rich silicon oxide material comprises forming a combined dielectric layer having a thickness between approximately 2.5 to 5 nm.

13. A method of forming a diffusion resistant thin film comprising:
   positioning a semiconductor substrate comprising silicon within a process zone of an oxidizing apparatus wherein said process zone is maintained at a first temperature and is fluidically coupled to a torch zone;
   providing an oxidizing atmosphere to said process zone wherein a silicon oxide layer having a first thickness is formed on said semiconductor substrate;
   increasing said first temperature of said process zone to a second temperature;
   introducing nitrous oxide ($N_2O$) to said torch zone, said torch zone heated to a torch introduction temperature, wherein an exothermic reaction forming a nitridizing atmosphere occurs therein; and
   directing said nitridizing atmosphere from said torch zone to said process zone wherein a layer of nitrogen-rich silicon oxide material, having a second thickness, is formed essentially underlying said silicon oxide layer, said layer of nitrogen-rich silicon oxide material and said silicon oxide layer comprising said diffusion resistant film.

14. The method of claim 13 wherein introducing nitrous oxide ($N_2O$) to a torch chamber comprises introducing said $N_2O$ at a flow rate between approximately 2 to 5 standard liters per minute (SLM), wherein said exothermic reaction increases said torch introduction temperature by at least approximately 50° C.

15. The method of claim 13 wherein a layer of nitrogen-rich silicon oxide material is formed, comprising forming said nitrogen-rich silicon oxide layer having a peak nitrogen concentration of at least approximately 1.5 atomic percent.

16. The method as recited in claim 13, wherein said directing the nitridizing atmosphere is conducted subsequently to said providing the oxidizing atmosphere.

17. The method as recited in claim 1, wherein said forming a nitridizing atmosphere comprises decomposing said nitrous oxide into nitric oxide.

18. The method as recited in claim 13, wherein said forming a nitridizing atmosphere comprises decomposing said nitrous oxide into nitric oxide.

* * * * *